United States Patent

Augustine

[15] 3,649,883

[45] Mar. 14, 1972

[54] SEMICONDUCTOR DEVICE HAVING A RECOMBINATION RING

[72] Inventor: Lawrence G. Augustine, Phoenix, Ariz.

[73] Assignee: Motorola, Inc., Franklin Park, Ill.

[22] Filed: Aug. 17, 1970

[21] Appl. No.: 64,412

[52] U.S. Cl. ................317/235 UA, 317/235 Z, 317/235 AE
[51] Int. Cl. ..........................................................H01l 3/00
[58] Field of Search ..........................................317/234, 235

[56] References Cited

UNITED STATES PATENTS

| | | | |
|---|---|---|---|
| 3,449,825 | 6/1969 | Lord | 29/578 |
| 3,556,744 | 1/1971 | Berkley | 29/183.5 |
| 3,409,974 | 11/1968 | Lueck | 29/420.5 |

OTHER PUBLICATIONS

" Schottky Diodes Make IC Scene" – Noyce et al.– Electronics July 21, 1969 pp. 75–80.

*Primary Examiner*—John W. Huckert
*Assistant Examiner*—E. Wojciechowicz
*Attorney*—Mueller and Aichele

[57] ABSTRACT

A transistor geometry is disclosed utilizing the interdigitation of the base area for increasing the effective base-collector junction periphery. A recombination ring is provided comprising in part parts of the base and collector for dissipating minority carriers injected into the collector region of the transistor from the base region. A metal contact adheres to the surface of the transistor in electrical contact across the base-collector junction.

4 Claims, 12 Drawing Figures

INVENTOR.
Lawrence G. Augustine

BY

Mueller & Aichele

ATTORNEYS

INVENTOR.
Lawrence G. Augustine
BY
Mueller & Aichele
ATTORNEYS

INVENTOR.
Lawrence G. Augustine

BY
*Mueller & Aichele*
ATTORNEYS

SEMICONDUCTOR DEVICE HAVING A RECOMBINATION RING

BACKGROUND OF THE INVENTION

One method of manufacturing prior art silicon NPN-transistors is through the double diffusion process wherein the base is initially diffused into a silicon substrate, followed by an emitter diffusion into the base region. One problem associated with this type of structure resides in the slow recombination of minority carriers caused by the excess base current injection into the collector region of the device which delays it from being switched from its saturated on condition to its off condition. More specifically, this excess base current is further explained in this manner. Since the emitter requires the injection of only a certain amount of base current during saturation, any additional base current must be recombined within the transistor structure.

For purposes of illustrating this problem, consider such a transistor requiring 5 milliamps of base current to drive the device into an active region collector current of 500 milliamps. The active beta is define as this collector current divided by this injected beta base current, and in this example equals 100. However, the total turn on base current is defined as the collector current divided by the forced beta and is usually greater than the injected beta base current by a factor of 5 to 10. The difference base current remaining after subtracting the injected beta base current from the total base current is considered excess base current, or saturation base current. A transistor is driven into saturation by this excess base current only because the collector current is limited by the external power supply and load resistance. In saturation the base collector junction is forward biased as distinguished from reverse biased when the device is in the nonsaturated or active region. The ratio of the base to collector doping causes the excess base current to be principally injected by the base into the collector region as minority carriers. Because of the inherent base resistance of the device there exists a distributed voltage drop across the base region of the device causing this junction to be most forward biased at the surface of the device upon which the base collector junction terminates. Since the junction is most efficient at this surface of the transistor, the minority carrier injection is principally near that surface of the transistor device. These stored injected minority carriers present in the collector region of the device in saturation are one factor in determining the turn off characteristic of the device.

The normal process used to utilize the recombination of these stored injected minority carriers is to induce recombination points by diffusion of foreign atoms, such as gold, into the device. The optimum location of gold doping is near the surface of the device in the collector region. However, the selective placement of the gold is difficult and it has probably never been successfully restricted to the collector surface region, but also diffuses into the emitter and base regions and below the base collector junction within the collector region. The placement of gold in these last mentioned regions degrades some of the electrical parameters and performance of the device. Three of the electrical parameters degraded are emitter efficiency, beta, and breakdown voltage.

A second prior art technique for improving the turn off time of the device is the use of a Schottky diode, shunting the collector base junction to prevent the device from saturating, displaced from the base-collector junction of the device either integrally located therewith or not, also known as a Baker Clamp. The Schottky diode is principally a majority carrier device and it was thought that it would operate satisfactorily in the situation described since the excess base current would flow through the Schottky diode principally as majority carriers being injected from the collector epitaxial layer into the metal contact of the Schottky diode, also know as a hot carrier diode.

Because this current flow is characterized by majority carrier current flow within the body of the semiconductor, recombination in the collector region is minimal. The absence of a need for recombination makes the Schottky diode device an improvement over the gold doped device.

However, the Schottky diode approach for solving this problem has an inherent limiting factor causing this solution to be inappropriate for high current, high voltage devices. The structure in which the Schottky diode and the transistor are formed contains at least a first bulk resistance between the upper Schottky diode surface of the semiconductor body and the lower substrate, and a second bulk resistance between the base-collector junction of the device and the lower substrate of the device. Both of these resistances exist because of the resistivity and thickness of the collector epitaxial region within which all the aforementioned are located. An average operating environment for illustrating this effect in a core driver includes a collector current of 500 milliamps and an average collector resistance value of 2 ohms giving a voltage drop of 1.0 v. from the bottom of the base collector junction to the substrate. This current flow is principally through the epitaxial layer located immediately below the base to the substrate layer. The majority carrier Schottky diode current of approximately 45 milliamps normally has to flow through the first resistance of approximately 8 ohms directly below the diode, producing a bulk resistance diode voltage drop of 360 millivolt. Adding the forward voltage diode drop of 440 millivolt to 750 millivolt, depending upon the type of diode metallization, to the aforementioned bulk resistance drop of 1,000 millivolt and 360 millivolt the total voltage drop, from the collector epi immediately below the collector base junction to the surface metal making ohmic contact to the base, of 1,800 millivolt minimum.

Because of the metallization path previously mentioned, this 1.8 volts is measurable across the base-collector junction and is actually greater than the voltage required to turn the junction on to 50 milliamps. Accordingly, the base collector junction of the transistor device turns on prior to the Schottky diode when the device is driven into saturation. Therefore, rather than having all of the excess base current flowing through the shunting Schottky diode and thereby eliminating the storage time associated with minority carrier injection, majority carriers in the collector are being injected along the upper surface of the transistor device due to the forward bias on the collector base junction and the voltage drop along the base resistance of the device. Hence, there is minority carrier injection along the surface of the structure and a corresponding recombination time which degrades the turn off characteristics of the device.

One impractical solution to this problem is to build the Schottky diode and the transistor device so large as to reduce the values of the first and second resistance values. But this involves increasing the capacitances of the combined structure to unreasonably high values causing a degradation of the delay, rise and fall times of the device.

SUMMARY OF THE INVENTION

This invention relates to semiconductor circuits and, more particularly, it relates to an improved structure for reducing the turn off time of the semiconductor circuit by minimizing the recombination time of majority carriers and improving emitter efficiency.

It is an object of the instant invention to provide an improved semiconductor.

It is a further object of the instant invention to provide a semiconductor device having improved turn off characteristics.

It is another object of the present invention to provide a semiconductor device utilizing a recombination ring uniquely positioned with respect to its associated transistor device for dissipating minority carriers in the collector due to the injected excess base current.

Another object of the present invention is to provide a distributed recombination ring in combination with an associated base region of a transistor.

A still further object of the present invention is to utilize a first base region in combination with the recombination ring adjacent to an adjacent base region.

A further object of the instant invention is to provide a semiconductor device having a metal contact adhering to the upper surface of the semiconductor body and contacting each side of the base collector junction.

These and other features will become fully apparent to those skilled in the art in the following description of the accompanying drawings, wherein.

BRIEF DESCRIPTION OF THE INVENTION

The present invention comprises a distributed recombination ring integrally formed with a transistor device in spatial relationship thereto in combination with metallization formed between the recombination ring, across the base collector junction and terminating in contact with the base region, whereby all excess holes, injected by the base due to the voltage developed over the internal diode resistances previously mentioned, recombine.

DETAILED DESCRIPTION OF THE INVENTION

Throughout the several views, identical elements of the various semiconductor structures are identified with the same numerals.

Figures 1, 2:
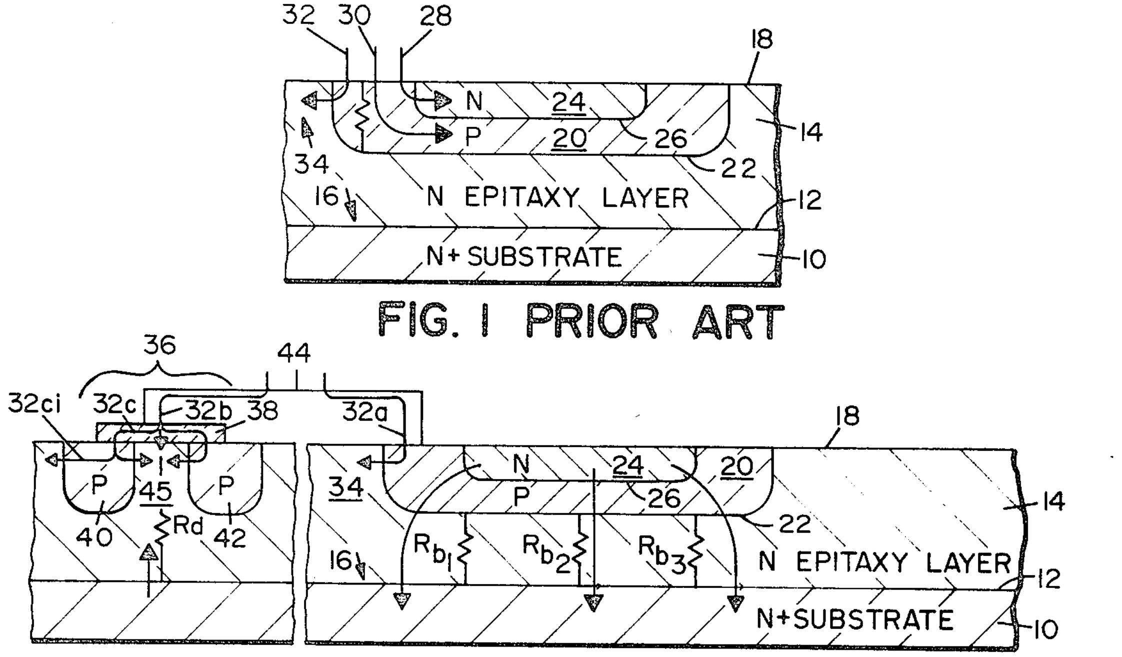
FIG. 1 PRIOR ART FIG. 2 PRIOR ART
FIG. 1 is a schematic view of a prior art device and the excess base current flowing therein.
FIG. 2 is a schematic view of a Schottky diode adjacent to and in combination with a transistor and the current flow therein.

Referring to FIG. 1, there is shown a semiconductor device comprising a substrate 10 of a first type of conductivity having a first surface 12 upon which an epitaxially formed layer 14 is integrally attached for creating an interface 16 therebetween and an upper surface 18 substantially parallel with the interface 16. The layer 14 is of the same or opposite conductivity type compared with said substrate 10 and serves as the collector region to be described. Through standard techniques a base diffusion region is shown at 20 having a base-collector junction 22 extending into the layer 14 and terminating at the upper surface 18. This region is of the opposite conductivity type as the collector region 14. An emitter region is shown as 24 and is of said opposite conductivity type as the base 20. A junction 26 is formed between the emitter and base regions 24 and 20 respectively terminating at the surface 18.

The beta base current is represented by arrows 28 and 30 wherein the component represented by the arrow 28 is the injected base current turning the transistor on while the current represented by the arrow 30 is the base recombination current. Excess base current injected into the collector is represented by the arrow 32.

The recombination of the excess current 32 is aided by gold doping in the region 34 represented by the shaded lines. However, the doping cannot be limited to this area and spreads throughout the device causing the aforementioned degraded performance.

Referring to FIG. 2, an adjacent Schottky diode 36 is added to the device shown in FIG. 1. The diode is represented by a metal layer 38 and two guard rings 40 and 42. An electrical connection between the base region 20 and the layer 38 is shown as the line 44.

The injected excess base current 32 is separated into three components represented by the arrows 32*a* and 32*b* and 32*c*. When device is driven into saturation, arrow 32*a* represents minority carrier injection into the collector through the collector base junction and which has to recombine in the collector region 34. Arrow 32*b* represents majority carrier current injected by the collector region into the metal 38 of the Schottky diode. The device shown in FIG. 2 includes distributed bulk resistance shown as a plurality of resistors $Rb_1$ through $Rb_3$ located between the base region 20 and the substrate 10. Another bulk resistance RD element is located between the substrate 10 and the Schottky diode 36. Arrow 32*c* represents the minority carrier injection into a region 45 from the guard rings 40 and 42.

Figure 3:
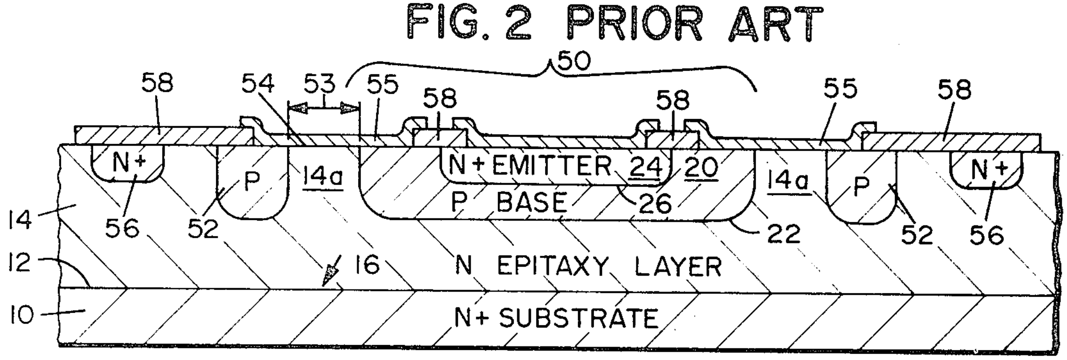
FIG. 3 is a schematic view of a recombination ring located according to the teaching of the present invention.

Referring to FIG. 3, there is shown a schematic cross section of a transistor constructed to the teaching of the present invention.

The base 20, emitter 24 and collector 14 regions of a transistor 50 are formed according to well-known techniques. During the base diffusion, a region 52 of opposite conductivity type as the collector 14 is established slightly displaced from the base region 20 and separated therefrom by a portion 14*a* of the collector region 14. This region forms part of the base region of the transistor. The displacement is represented by a line 53 and in the preferred embodiment is approximately 0.4 mils. This displacement is not a limitation on the invention nor is the cross-sectional appearance of any region shown in the Figure. Cup shaped regions have been used as a convenience even though other designs are known. Additionally, only two plan views of this device out of the many available are shown since the invention broadly described is not limited by the geometric shape assumed by the base region but resides in the spacial relationship of the base region 20 and the recombination ring 14*a* and an interface 54 of the region 14*a* and a metallization layer 55 adhering to the interface portion 54 of the surface 18 and covering the junction 22 while in intimate electrical contact with base region 20 and collector region 14*a*. The recombination ring 14*a* shown in FIG. 3 surrounds the base region 20. The metallization layer 55 assumes essentially the same shape as the ring 14*a* and base combination except as hereinafter mentioned.

A region 56 of the same conductivity as the emitter 24 surrounds the composite structure described thus far and is conveniently formed during the emitter region 24 diffusion step. This region 56 performs the well-known function of terminating any channel which might be induced at the surface 18 of the structure by an inversion at such surface 18 due to ionic contamination in a passivation layer 58 shown at various surface locations for well-known protection purposes.

The recombination region is represented at the interface 54 between the regions 14*a* and the metallization layer 55. The layer 55 is intimately connected to the base region 20 of the transistor 50 at the common surface 18 and is a simple metal extension of the base contact outward to the region 52 creating a metal overlay over the collector-base junction 22 in electrical contact with both the base regions 20 and 52 and the collector region 14*a*.

The layer 55 and its placement with respect to the base regions 20 and 52 and collector region 14*a* does not cause a degradation of collector base breakdown voltage with the emitter open since values in excess of 90 volts $BV_{CBO}$ are measurable on completed devices.

Figures 6, 7, 8, 9:
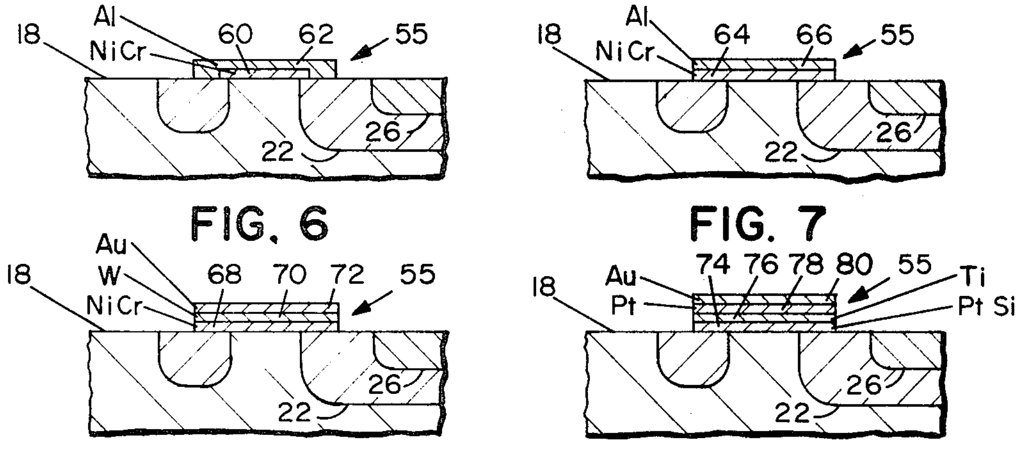
FIGS. 6 through 9 show various approaches for forming the metallization element of the present invention.
Figure 11:
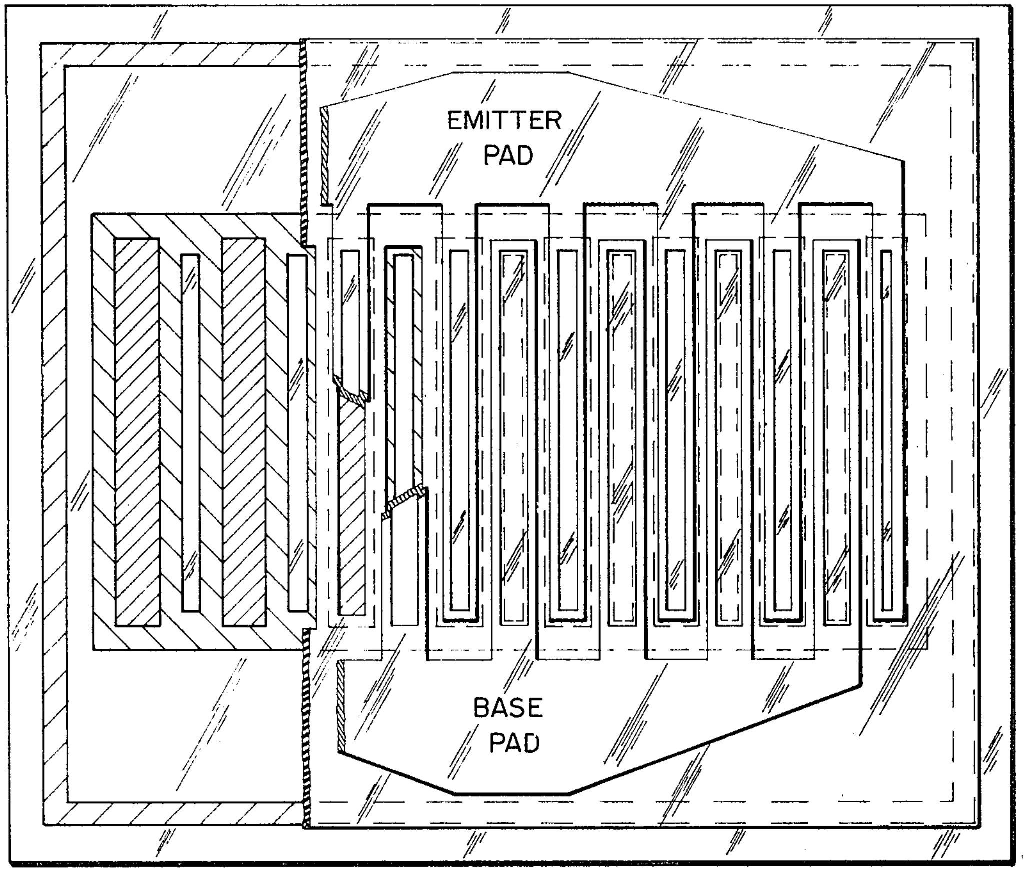

The metal layer 55 may be of any standard type normally used with semiconductors. Acceptable results achieved by utilizing a nichrome portion 60 covering the surface portion of the collector 14*a* and then using an aluminum portion 62 over the nichrome and the rest of the contact area of the bases is shown in FIG. 6. Another approach is to deposit nichrome as a lower portion of nichrome 64 as shown in FIG. 7 with an upper portion 66 of aluminum. Another approach as shown in FIG. 8, includes a first layer 68 of nichrome, followed by a second layer 70 of tungsten and a final layer 72 of gold. A still further approach as shown in FIG. 9, employs a first layer 74 of platinum silicide, a second layer 76 of titanium, a third layer 78 of platinum followed by a final layer 80 of gold. The composition of the layer 55 affects the overall recombination time of the resulting transistor 50 and the efficiency of the Schottky diode. The aluminum and nichrome metallization layer at a collector current of one ampere gives a recombination time of 28 to 30 nanoseconds for a device with a $BV_{CEO}$ greater than 40 volts. The platinum silicide, titanium, platinum, gold layer, at one ampere collector current gives a recombination time of 13 to 16 nanoseconds for a device with a $BV_{CEO}$ greater than 25 volts. The nichrome, tungsten, gold layer 55 at one ampere collector current gives a recombination time of 25 to 30 nanoseconds for a device with a $BV_{CEO}$ greater than 42 volts. Enhanced high current performance is apparent in all three devices and is also seen in good rise and fall time characteristics.

Figure 4:
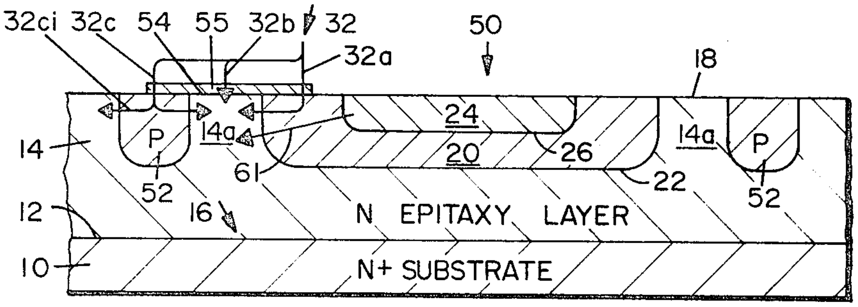
FIG. 4 is a schematic view showing the current flow of the device shown in FIG. 3.

The operation of the present invention is demonstrated with reference to FIG. 4 wherein a basic transistor 50 and a recombination region 54 combination is shown. The excess base current is represented by the arrow 32 which is subdivided into majority carrier portion 32*b* and minority carrier portions 32*a* and 32*c*. One of the advantages of the present invention is that electrons injected by the emitter go directly into the region 14*a* by way of sideward diffusion as represented by the arrow 61 without having first to travel all the way through both the bulk resistances described previously. The voltage drop associated with resistances $Rb_1$ through $Rb_3$ and RD of FIG. 2 is thus greatly eliminated. The minority current component 32*c* includes a further component 32*ci* which is an injected current subdividing out of the minority current flow 32*c* and being injected into a region having no compensation therefor. This current is minimized by the interdigitized design referred to with reference to FIG. 5. However, because of the division of the excess base current, the present invention exhibits a faster recombination time and improved emitter efficiency compared to gold doped devices resulting in improved turn on and turn off characteristics.

The recombination region 14*a* as represented in the preferred embodiment is continuous through out the periphery of the base region 20. However, it need not be continuous and may assume an interrupted design insofar as portions of a recombination region can be separated by portions of the base. The metallization layer 55 follows this interrupted configuration.

One process for making a transistor device having a recombination region includes beginning with a substrate having a first type conductivity followed by the formation of an epitaxial layer thereon having an appropriate type conductivity of the desired collector region. A preoxide step prepares the upper surface for subsequent diffusion steps. An oxide mask is now formed over the upper surface having diffusion openings therein for the base regions using photoresist techniques. An oxide layer forms over these regions during the base diffusion cycle. New openings are made in the surface oxide using photoresist techniques through which the emitter and annular ring are diffused, subsequent to which is formed another protective oxide, thereby completing the diffusion of the active regions of the device. Using photoresist techniques openings are formed in the oxides exposing portions of the emitter for an emitter contact and portions of the base and collector recombination region as a continuous exposed area for forming an integral base contact and recombination metallization element.

Figure 5:
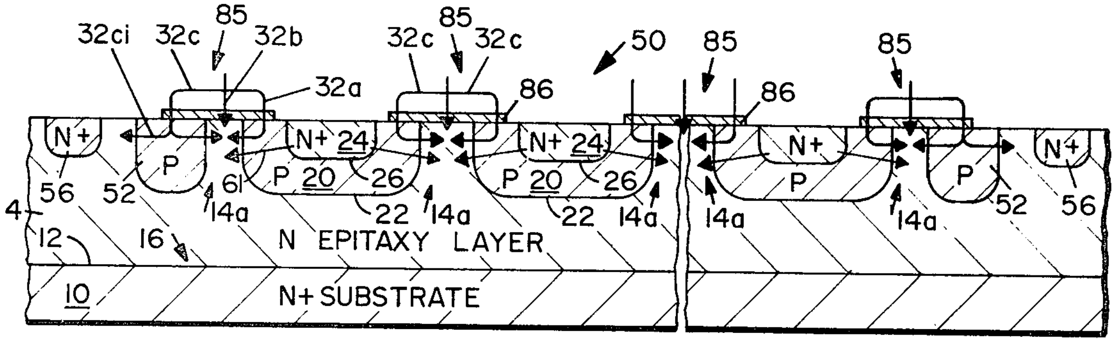
FIG. 5 shows a cross-sectional view of a preferred embodiment of a device utilizing the present invention.
Figure 10:
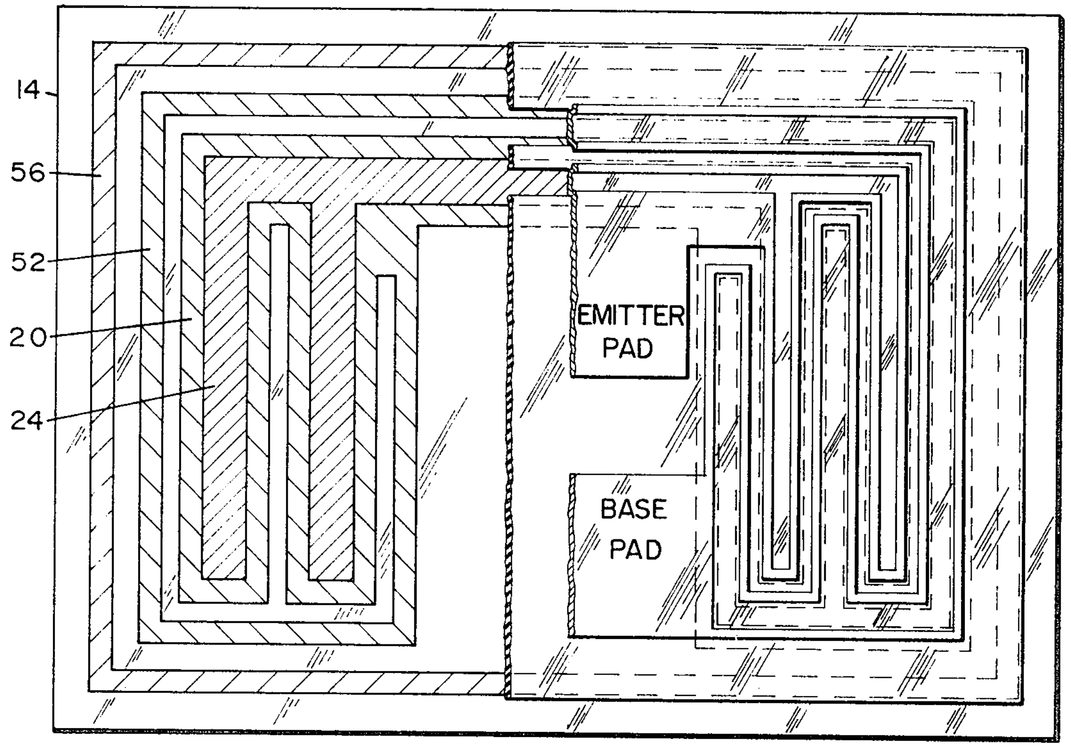
FIGS. 10 and 11 show a plan view of two devices of different geometries but following the teaching illustrated in FIG. 5.

Referring to FIG. 5 there is shown in cross sectional view, the preferred embodiment of the invention. FIG. 10 shows a plan view of the same device. A plurality of base regions 20 are formed with each having an integrally formed emitter region 24. An annular ring 56 surrounds the entire transistor 50, which is composed of a plurality of base 20 regions and emitter 24 regions and recombination regions 14*a* therewith. Internal to the ring 56 is the recombination ring 14*a* as previously described and represented in this Figure by a numeral 85. The excess base currents flowing through this device are shown by the arrows 32*ci*, 32*b* and 32*a*.

An additional significant feature shown in this figure is the plurality of additional metallization layers 86 adhering to the upper surface 18 of the transistor 50 and covering both the base region 20 and collector region-recombination region 14*a* of adjacently interdigitated portions of the base. The layers 86 are effective for electrically connecting adjacently positioned base members. The intervening collector portion 14*a* forms a further recombination device within the scope of the instant invention.

Figure 12:
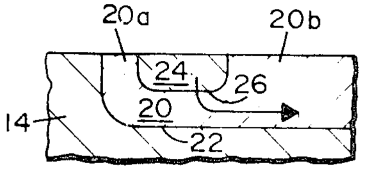
FIG. 12 shows the placement of the emitter region within the base region so as to eliminate the requirement of an outer recombination ring area.

FIG. 12 shows the eccentric placement of the emitter region 24 within the base region 20. This placement results in a base surface and subsurface element having a minor section 20*a* and a major section 20*b*. A recombination ring need only be placed adjacent the major portion 20*b* of the outermost component of the base since the high resistance in the minor portion 20*a* causes the base current to flow into and out of the major portion leaving substantially less current flowing out of the minor portion 20*a*. This approach partially eliminates the need for a guard ring on the outside of a base region. Therefore, recombination rings need only be employed on interior portions of a transistor and need not surround the transistor as the one shown in FIG. 10.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:
   - a body of semiconductor having a surface and containing a transistor having alternate first and opposite conductivity type regions for emitter, base, and collector regions in superposed relationship respectively;
   - said base and emitter regions having a plurality of interdigitated regions joined as an integral unit at one end and having a collector portion of said body interposed between adjacent regions of said base and surrounding the remaining regions of said base and said collector portions of said body operating as a recombination ring for said adjacent regions of said base;
   - said emitter having a plurality of interdigitated regions joined as an integral unit at one end and being in superposed relationship with corresponding regions of said base;
   - a metallization layer having at least a first portion adherent to said surface and covering portions of said recombination region and adjacent interdigitated regions of said base and being electrically connected to said recombination region and adjacent interdigitated regions of said base for operating as a base contact;
   - a plurality of contacts attached to said emitter and collector regions respectively; and
   - a passivating layer adherent to said surface.

2. A semiconductor device as recited in claim 1, wherein said metallization layer comprises:
   - a first layer of nichrome;
   - a second layer of tungsten; and
   - a third layer of gold.

3. A semiconductor device as recited in claim 1, wherein said metallization layer comprises:
   - a first layer of nichrome; and
   - a second layer of aluminum.

4. A semiconductor device as recited in claim 1 wherein said emitter region is offset within said base region for providing said base region with a major section and a minor section and said metallization layer covering said major base region and said adjacent body portion.

* * * * *